July 9, 1968 M. J. SCHULLER 3,391,452

METHOD OF MAKING A RELIABLE LOW-OHMIC NONRECTIFYING CONNECTION TO A SEMICONDUCTOR SUBSTRATE

Filed May 16, 1966

INVENTOR
MAX J. SCHULLER
BY R. C. Smith
ATTORNEY

United States Patent Office 3,391,452

Patented July 9, 1968

3,391,452

METHOD OF MAKING A RELIABLE LOW-OHMIC NONRECTIFYING CONNECTION TO A SEMICONDUCTOR SUBSTRATE

Max J. Schuller, Palo Alto, Calif., assignor to Hewlett-Packard Company, Palo Alto, Calif., a corporation of California Filed May 16, 1966, Ser. No. 550,206
3 Claims. (Cl. 29—578)

ABSTRACT OF THE DISCLOSURE

A masking layer having an opening therein is formed on an N-type layer, and a P-type region is diffused through the opening in the masking layer into the N-type layer to the depth of a contiguous P-type layer. The opening in the masking layer is then enlarged to expose a previously unexposed portion of the P-type region that diffused beneath the masking layer, and a metal contact is formed on this previously unexposed portion of the P-type region. Before forming the metal contact, another P-type region may be diffused through the enlarged opening in the masking layer to insure that all of the area exposed by the enlarged opening is P-type.

This invention relates to integrated circuit chips where the circuit is fabricated on an upper semiconductor layer of one conductivity type and where a contiguous semiconductor substrate of a different conductivity type is used as a common voltage plane which is connected through the upper semiconductor layer to selected portions of the integrated circuit.

The advantage of using the substrate in this manner is that it saves space on the integrated circuit chip by eliminating a voltage bus and therefore permits the packing density of the integrated circuit to be increased. However, the substrate can only be used in this manner when both the resistance of the substrate and the resistance of the connection to the substrate are kept below some minimum value which varies from integrated circuit to integrated circuit.

Figure 1:
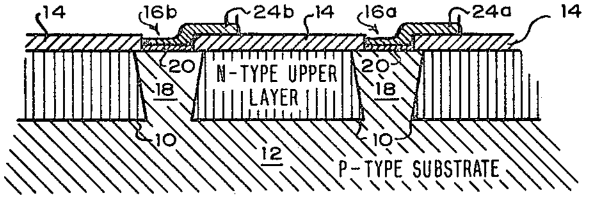
Figure 1 PRIOR ART

The conventional method of making a connection to a substrate is illustrated with the aid of FIGURE 1 which shows, for example, and N-type upper layer 10 and a contiguous P-type substrate 12. A masking layer 14 is formed on the N-type upper layer 10. This masking layer 14 is provided with an opening **16*a* or *b* through which an impurity such as boron is diffused to form a P-type region 18 which extends to the P-type substrate 12. An insoluble high-resistance boron film 20 is formed on the surface of the region 18 during this diffusion. The boron film 20 separates a metallic contact 24*a* or *b* that is subsequently formed in the opening 16*a* or *b* from the surface of the P-type region 18 so that the resistance of the connection to the P-type substrate 12 is substantially increased. Thus, the connection resistance as measured between the metallic contacts 24*a* and *b* for integrated circuit chips tested was typically greater than eighty ohms. Moreover, the boron film 20 caused an open circuit between some of the metallic contacts and formed a rectifying junction between others. One cannot be sure that this boron film 20** will be removed by etching without exposing the integrated circuit chip to the etchant for a length of time which may harmfully erode other parts of the integrated circuit.

Accordingly, it is the principal object of this invention to provide a method of making a reliable, low-ohmic nonrectifying connection to the semiconductor substrate without regard to the formation of a boron film or the like.

This object is accomplished according to the illustrated embodiment of this invention by enlarging the opening **16*a* or *b* in the masking layer 14 once the boron diffusion has been performed to expose a portion of the region 18 on which the boron film 20 has not been formed. Thus, when the metallic contact 24*a* or *b* is subsequently formed in the opening 16*a* or *b* it makes direct contact with this portion of the region 18**.

Figure 2:
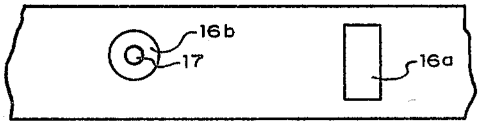
Figure 3:
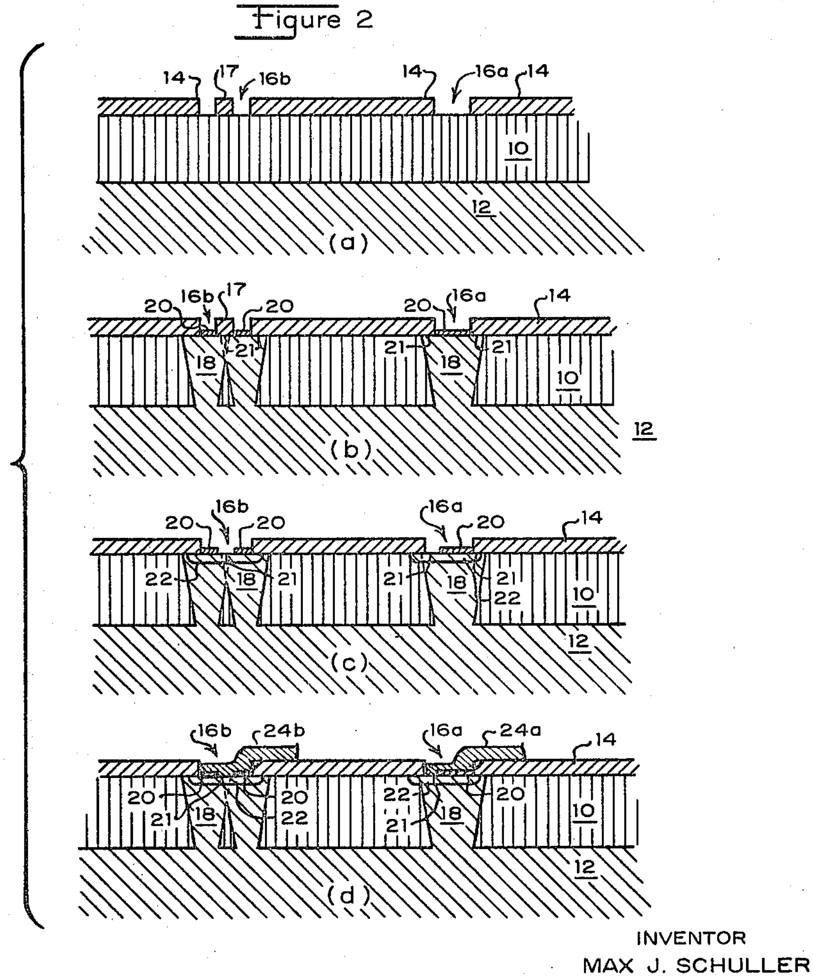

Other and incidental objects of this invention will be apparent from a reading of this specification and an inspection of the accompanying drawing in which:

FIGURE 1, which has already been referred to above, is a sectional view of an integrated circuit chip illustrating the conventional method of making a connection to a substrate;

FIGURE 2 is a top view of an integrated circuit chip illustrating the first step in making a connection to a substrate according to a preferred embodiment of the method of this invention; and FIGURE 3 is a series of sectional views of the integrated circuit chip of FIGURE 2 illustrating each of the steps in this preferred embodiment.

Referring now to FIGURES 2 and 3(*a*), there is shown a semiconductor chip comprising, for example, an upper layer 10 of N-type silicon on which an integrated circuit is to be formed and a substrate 12 of P-type silicon which is to be used as a common voltage plane for selected portions of the integrated circuit. The first step in connecting one of these selected portions of the integrated circuit to the P-type substrate 12 through the N-type upper layer 10 is to form a silicon dioxide masking layer 14 on the surface of the N-type upper layer. An opening **16*a* or *b* is etched in the masking layer 14 so as to expose a selected area of the N-type upper layer where it is desired to form the connection to the P-type substrate 12. However, this opening is made smaller than the area on which a metallic contact terminal 24*a* or *b* is to be formed during a subsequent step. This may be done in many ways as indicated by the masking layer island 17 which is retained within the opening 16*b***.

The next step, as shown in FIGURE 3(*b*), is to diffuse an impurity such as boron into the N-type upper layer 10 through the openings **16*a* and *b* so as to form P-type regions 18 which extend through the N-type upper layer to the P-type substrate 12. This may be done, for example, by depositing boron on the exposed surface of the N-type upper layer 10 at a temperature of about 1100° C. for about twenty minutes. The diffusion which is started during this depositing substep is completed at a temperature of about 1200° C. for about two hours. During this diffusion step an insoluble high-resistance boron film 20 of about one thousand angstroms in thickness is formed on the exposed surface of each region 18**.

There is sufficient lateral diffusion during the diffusion step so that a portion 21 of the upper surface of each region 18 extends laterally beneath the masking layer 14 a finite distance from the edges of the opening **16*a* or *b* associated with that region. Since this portion 21 of the upper surface of each region 18 is covered by the masking layer 14 the boron film 20** is not formed thereon during the diffusion step. Thus, the next step, as shown in FIGURE 3(*c*), is to enlarge the openings **16*a* and *b* in the masking layer 14 so as to at least partially expose the portion 21 of each region 18. This is done, for example, by etching away some of the masking layer 14 at one side of the opening 16*a* and by etching away the masking layer island 17 previously retained within the opening 16*b***.

Although not essential, the next step which is also shown in FIGURE 3(*c*) may be to diffuse a thin P-type layer 22 into the upper surface of each region 18 through the enlarged opening **16*a* or *b* associated therewith to be sure that all of the surface area exposed by enlarging that opening is made a part of the P-type region 18. This may be done by depositing boron on the surface exposed by the enlarged openings 16***a* and *b* at a temperature of about 1000° C. for about ten minutes. The diffusion which is started during this depositing substep is completed at a temperature of about 1200° C. for about one hour. Any boron film that may be formed during this diffusion step is insignificant compared to the boron film 20 formed during the first diffusion step because of the shorter diffusion time and the lower predeposit temperature. Moreover, it can be be easily removed in an etching substep of short duration that will not harm other portions of the integrated circuit. This second diffusion step may be performed at the same time the base regions of the transistor portions of the integrated circuit are being formed since these base regions are formed in a similar manner.

The last step, as shown in FIGURE 3(*d*), is to form, for example, an aluminum contact terminal 24*a* or *b* on the exposed portion 21 of each region 18. Since each exposed portion 21 is free of the boron film 20 the aluminum contact terminals 24*a* and *b* are connected directly to the P-type regions 18 and, hence, to the P-type substrate 12. Thus, a reliable, low-ohmic nonrectifying connection is made between the P-type substrate 12 and selected portions of the integrated circuit connected to the aluminum contact terminals 24*a* and *b*. The connection resistance as measured between the metallic contact terminals 24*a* and *b* for integrated circuit chips tested was typically about eight ohms, or an order of ten lower than the lowest resistance that was measured when the conventional method was used to form similar connections to the P-type substrate 12.

I claim:

1. A method of making a low-ohmic nonrectifying connection through one layer of semiconductor material of one conductivity type to another contiguous layer of semiconductor material of another conductivity type comprising the steps of:

forming upon a surface of said one layer a masking layer having an opening therein exposing a selected area of said surface;

diffusing into said one layer through said opening a region of said other conductivity type, which region extends through said one layer to said other layer and extends laterally beneath said masking layer at said surface a finite distance from the edge of said opening;

enlarging said opening to expose a portion of said region which extends laterally beneath said masking layer; and forming on said portion of said region through the enlarged opening a conductive contact which is connected through said region to said other layer.

2. A method as in claim 1 including after said enlarging step the additional step of diffusing into the exposed surface of said region through said enlarged opening a thin layer of semiconductor material of said other conductivity type.

3. A method as in claim 2 wherein for each step of said method said one conductivity type is N-type and said other conductivity type is P-type.

References Cited

UNITED STATES PATENTS

| | | | |
|---|---|---|---|
| 3,246,214 | 4/1966 | Hugle. | |
| 3,289,267 | 12/1966 | Ullrich | 29—578 |

WILLIAM I. BROOKS, *Primary Examiner.*